United States Patent [19]

Araki

[11] 4,042,839
[45] Aug. 16, 1977

[54] LOW POWER DISSIPATION COMBINED ENHANCEMENT DEPLETION SWITCHING DRIVER CIRCUIT

[75] Inventor: Yoshikazu Araki, Kodaira, Japan
[73] Assignee: Hitachi, Ltd., Japan
[21] Appl. No.: 660,777
[22] Filed: Feb. 24, 1976
[30] Foreign Application Priority Data
    Feb. 26, 1975  Japan ................................. 50-22933
[51] Int. Cl.$^2$ .................... H03K 19/08; H03K 19/40; H03K 17/04; H03K 17/10
[52] U.S. Cl. .................................. 307/270; 307/205; 307/214; 330/35
[58] Field of Search ............... 307/205, 214, 251, 270, 307/304; 330/35, 15, 16

[56] References Cited
U.S. PATENT DOCUMENTS

| | | | |
|---|---|---|---|
| 3,700,981 | 10/1972 | Masuhara et al. ................ | 307/205 X |
| 3,775,693 | 11/1973 | Proebsting ........................ | 307/214 X |
| 3,778,784 | 12/1973 | Karp et al. ....................... | 307/238 X |

OTHER PUBLICATIONS

Aoki et al., "Field-Effect Transistor Driver Circuit," *IBM Tech. Discl. Bull.*, vol. 17, No. 7, pp. 2066-2067, 1974 (Dec.).

*Primary Examiner*—John S. Heyman
*Assistant Examiner*—Larry N. Anagnos
*Attorney, Agent, or Firm*—Craig & Antonelli

[57] ABSTRACT

In a push-pull output circuit comprising inverters, each using a depletion-type load field-effect transistor (FET) and an enhancement-type driving FET, an intermediate inverter including a depletion-type load FET and an enhancement-type driving FET is added between the input side and output side inverters. The load impedance of the output side inverter is set at a value much smaller than those of the other inverters. The utilization of a power supply voltage is enhanced because of the use of depletion-type FET's and the total current in the circuit is low due to the use of the intermediate inverter.

5 Claims, 3 Drawing Figures

LOW POWER DISSIPATION COMBINED ENHANCEMENT DEPLETION SWITCHING DRIVER CIRCUIT

BACKGROUND OF THE INVENTION

1. Field of the Invention

This invention relates to a push-pull output circuit using insulated-gate type field-effect transistors (IGFET or MISFET, referred to simply as FET, hereinbelow), and more particularly to a push-pull output circuit using both enhancement-type and depletion-type FET's disposed in a semiconductor substrate.

2. Description of the Prior Art

Many push-pull output circuits using FETs have been proposed for switching or digital circuits such as in a circuit for an electronic desk top calculator. Since such push-pull output circuits are generally formed as integrated circuits or large-scale integrated circuits on silicon chips together with the other digital circuits, low power consumption thereof is required. An example of a push-pull circuit comprises first and second inverters, each formed of an enhancement-type load FET and an enhancement-type driving FET. In such circuits, the utilization of the power supply voltage is low due to the built-in potential in respect of the substrate in the load FET, namely, the substrate bias applied to the substrate acting as a second gate of the FET. Recently, another type of push-pull FET output circuit has been proposed which utilizes depletion-type FETs as the load elements. But such a circuit is also accompanied with the drawback that the power consumption is large.

SUMMARY OF THE INVENTION

An object of this invention is to provide a push-pull output circuit utilizing depletion-type FETs as the load FET which has low power consumption.

Another object of this invention is to provide a push pull output circuit arrangement including both depletion-type and enhancement-type transistors in a semiconductor substrate in integrated circuit form which is free from the output level loss due to the built-in potential.

The other objects, features and advantages of this invention will become apparent from the following description made in conjunction with the accompanying drawings.

DESCRIPTION OF THE PREFERRED EMBODIMENT

Figure 3:
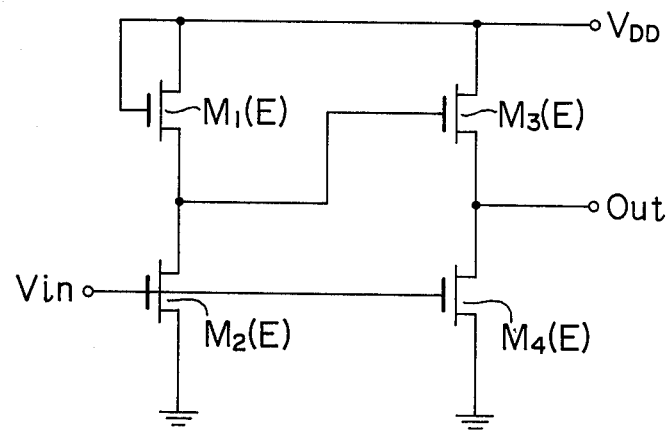

For easy understanding of this invention an example of the conventional push-pull output FET circuit is shown in FIG. 3, which comprises an input side inverter including enhancement-type FETs $M_1$ and $M_2$ and an output side inverter including enhancement-type FETs $M_3$ and $M_4$. The inverted output of the input side inverter is applied to the gate of the load FET $M_3$ of the output side inverter.

In such a push-pull output circuit, however, the source voltages of the FETs $M_1$ and $M_3$ become low compared to the power supply voltage $V_{DD}$ due to the built-in potential or substrate bias in the FETs. Namely, the source voltage of the load FET $M_1$ becomes $V_{DD} - V_{th}$ ($V_{th}$: threshold voltage of the FET), and hence, the source voltage of the load FET $M_3$, i.e. the voltage at the output terminal, becomes much smaller by the threshold voltage $V_{th}$ of this FET $M_3$ than this voltage $V_{DD} - V_{th}$. Thus, this type of push-pull circuit exhibits poor utilization of the power supply voltage.

Figure 2:
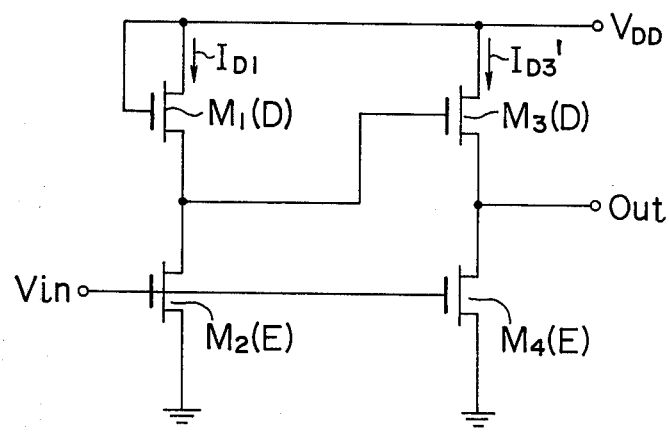
FIGS. 2 and 3 are circuit diagrams of the conventional push-pull FET output circuits.

Along with the recent developments of the depletion-type FETs, such a push-pull circuit utilizing depletion-type FETs for the load as shown in FIG. 2 has been proposed. In this circuit, the gate of the load FET $M_1$ is short-circuited with its drain for holding the voltage level sufficiently high. This can prevent undesirable lowering of the output level. Such a circuit, however, causes a problem of larger power consumption.

These problems can be solved by the circuit structure according to this invention.

Figure 1:
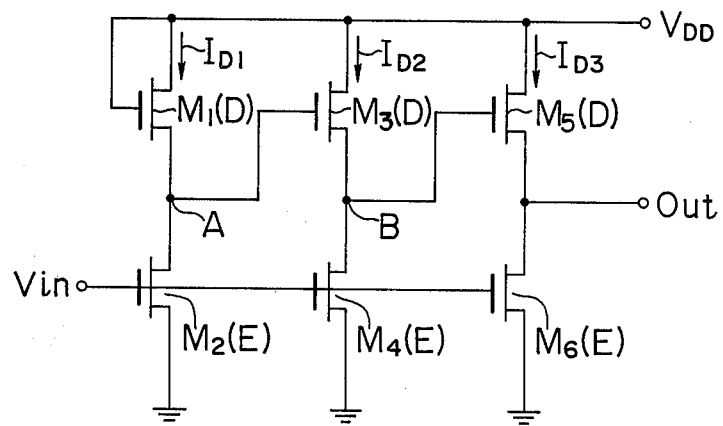
FIG. 1 is a circuit diagram of the push pull FET output circuit according to an embodiment of this invention.

An embodiment of the present push-pull FET circuit is shown in FIG. 1, which comprises three inverters, each comprising a depletion-type load FET $M_1$, $M_3$ or $M_5$ and an enhancement-type driving FET $M_2$, $M_4$ or $M_6$. The output of the first inverter ($M_1$ and $M_2$) is applied to the gate of the load FET $M_3$ of the second inverter ($M_3$ and $M_4$), and the output of the second inverter ($M_3$ and $M_4$) is applied to the gate of the load FET $M_5$ of the third inverter ($M_5$ and $M_6$). An output terminal of the third inverter $M_5$ and $M_6$ forms the output of the circuit. An input signal $V_{in}$ is applied commonly to the respective inverters.

Now assume that the ratios of the width to the length of the channel region of the load FETs $M_1$, $M_3$ and $M_5$ are denoted as $\beta_{l1}$, $\beta_{l3}$ and $\beta_{l5}$, respectively.

The first and second inverters ($M_1$ and $M_2$, $M_3$ and $M_4$) are respectively provided for driving the succeeding inverters each having a relatively small input capacitance, as opposed to the third inverter ($M_5$ and $M_6$) for driving a line or output circuit, connected to its output, having a stray capacitance which is substantially greater than the above input capacitance. Therefore, the respective currents flowing through the first and second inverters will usually be much smaller than that through the third inverter.

For this reason, each of $\beta_{l1}$ and $\beta_{l3}$ is determined to be very much smaller than $\beta_{l5}$ in the geometrical configuration of the load FETs fabricated in a semiconductor substrate, for example $\beta_{l1} = \beta_{l3} = 0.20$ and $\beta_{l5} = 50$.

According to the above arrangement, the following effects can be obtained.

1. Output level:

Since depletion-type FETs are used for the FETs $M_3$ and $M_5$, there is no level loss due to the built-in potential. Thus, a voltage substantially equal to the power supply voltage $V_{DD}$ can be obtained at the output terminal of this push-pull output circuit.

2. Power consumption:

Comparison will be made on the currents allowed to flow in the circuits of FIGS. 1 and 2. In either of these circuits, no current is allowed to flow when the driving FETs are cut off. Thus, description will be made of the case where the driving FETs are conductive (i.e. when there is a ground side level output). Currents flowing through the respective inverters in the circuit of FIG. 1 are denoted as $I_{D1}$, $I_{D2}$ and $I_{D3}$ and those through the inverters in the circuit of FIG. 2 as $I_{D1}$ and $I_{D3}'$ as shown in the figures.

In the circuit of FIG. 1, the load impedances of the first and second inverters are determined to be extremely large compared to that of the third inverter (for example, 400 : 1). Thus, the currents $I_{D1}$ and $I_{D2}$ flowing through the first and the second inverters become extremely small (about 1/400 ) with respect to the current $I_{D3}$ through the third inverter and hence can be neglected. Similarly, in the circuit of FIG. 2, the current $I_{D1}$ can be neglected with respect to the current $I_{D3}'$.

It is easily seen from the above that comparison of the currents flowing through the two circuits can be effected by the comparison of the currents $I_{D3}$ and $I_{D3}'$.

Further, if the load FET $M_5$ in the circuit of FIG. 1 is designed to have the same conditions as those of the load FET $M_3$ in the circuit of FIG. 2, their impedances are determined in inverse proportion to the magnitude of the voltage applied to their gates.

On these assumptions, the current consumption will be compared.

In FIG. 1, the voltage level at the output point A of the first inverter becomes closer to the ground level than the supply potential $V_{DD}$. This level at the point A is applied to the gate of the load FET $M_3$ of the second inverter. Thus, the impedance of the load FET $M_3$ of the second inverter becomes larger than that of the load FET $M_1$ of the first inverter the gate of which is applied with the power supply voltage $V_{DD}$. Hence, the level at the output point B of the second inverter becomes of a further lower value, nearer to the ground level, than that at said point A. In this respect, in the circuit of FIG. 2, the voltage level at the point A is applied to the gate of the load FET $M_3$ which provides the output of the circuit.

As is apparent from the above results, the current $I_{D3}$ allowed to flow through the output side inverter of the circuit of FIG. 1 is smaller than the current $I_{D3}'$ through the output side inverter of the circuit of FIG. 2.

The reasons why the current consumption is reduced have been described conceptually hereinabove. In the following description, comparison will be made qualitatively using calculated values.

In FIG. 1, denoting the width to length of the channel region of the load FETs $M_1$, $M_3$ and $M_5$ as $\beta_{l1}$, $\beta_{l3}$ and $\beta_{l5}$ as described above, respectively, the threshold voltage as $V_{th}$, the outputs of the first and second inverters as $V_{01}$ and $V_{02}$, respectively, and the constant determined by the dielectric constant of the gate insulator layer, etc. as $\beta_o$, the currents $I_{D1}$, $I_{D2}$ and $I_{D3}$ flowing through the FETs $M_1$, $M_3$ and $M_5$ can be represented by $$I_{D1} = \beta_o \beta_{l1} \{(V_{DD} - V_{th})(V_{DD} - V_{01}) - \tfrac{1}{2}(V_{DD} - V_{01})^2\} \quad (1),$$

$$I_{D2} = \beta_o \beta_{l3}/2 \, (V_{01} - V_{th})^2 \quad (2), \text{ and}$$

$$I_{D3} = \beta_o \beta_{l5}/2 \, (V_{02} - V_{th})^2 \quad (3).$$

In the circuit of FIG. 2, the current flowing through the input side inverter is similar to the above $I_{D1}$ and hence can be represented by the equation (1), and the current $I_{D3}'$ flowing through the output side inverter can be represented by $$I_{D3}' = \beta_o \beta_{l5}/2 \, (V_{01}' - V_{th})^2 \quad (4).$$

Where $V_{01}'$ is the output level of the input side inverter ($M_1$ and $M_2$).

In the circuit of FIG. 1, since each of the width-to-length ratios $\beta_{l1}$ and $\beta_{l3}$ is determined to be considerably smaller than $\beta_{l5}$ as described above, the currents $I_{D1}$ and $I_{D2}$ determined by the equations (1) and (2) become very small with respect to $I_{D3}$ determined by the equation (3) and hence these currents can be neglected. Similarly, in the circuit of FIG. 2, the current $I_{D1}$ obtained by the equation (1) can also be neglected with respect to the current $I_{D3}'$ obtained by equation (4).

In the comparison between $I_{D3}$ and $I_{D3}'$, the output level $V_{02}$ of the second inverter in the circuit of FIG. 1 is smaller than the output level $V_{01}'$ of the input side inverter in the circuit of FIG. 2. Accordingly, the current $I_{D3}$ calculated by the equation (3) is smaller than the current $I_{D3}'$ calculated by the equation (4), noting that $V_{th}$ is regarded to be negative in those equations in the consideration that it is a depletion type.

Using the above formula, calculation was performed on the assumptions that the impedence ratio of the load FET $M_1$ (or $M_3$) to that of the load FET $M_5$ in FIG. 1 and the impedance ratio of the load FET $M_1$ to that of the load FET $M_3$ in FIG. 2 were both 400 : 1 and that the power supply voltage $V_{DD}$ was − 16 volts.

The total current flowing through the circuit of FIG. 1 according to this invention became 1.1 mA from equations (1) to (3), whereas that through the conventional circuits of FIG. 2 became 4.1 mA from equations (1) and (4). Thus, the current in the present circuit became about one fourth of that in the conventional circuit.

From this result, it is seen that according to this invention there is provided a push-pull output circuit having a small loss of output level and a small power consumption.

Further, there is provided another advantage that the output level (ground side level) becomes closer to the ground level since the load impedance of the output side inverter becomes larger compared to that of the conventional one.

The present invention is not limited to the above embodiment but may be applied in various forms. For example, the impedances of the load FETs $M_1$ and $M_3$ of the first and second inverters were made equal in the above embodiment, but their values may be altered.

This invention can be used widely in the push-pull output circuits using FETs, and in particular can be used in digital data processing systems fabricated as large-scale integrated (LSI) circuits using metal-oxide-semiconductor field-effect transistor (MOSFET) technology.

I claim:

1. A push-pull inverter circuit comprising in combination:

first and second inverters, each including at least one depletion-type load field-effect transistor and one enhancement type driving field-effect transistor;

a third inverter having an extremely small load impedance with respect to those of said first and second inverters and including at least one depletion-type load field-effect transistor and one enhancement-type driving field-effect transistor;

input terminals of the respective inverters being connected to a common input line;

the gate and drain of the load field-effect transistor of said first inverter being short-circuited;

an output terminal of said first inverter being connected to the gate of the load field-effect transistor of said second inverter;

an output terminal of said second inverter being connected to the gate of the load field-effect transistor of said third inverter; and an output terminal of said third inverter providing an output of the circuit.

2. The push-pull output inverter circuit according to claim 1, in which each of the load field-effect transistors in said first and second inverters has a width to length ratio of the channel region considerably smaller than that of the load field-effect transistor in said third inverter.

3. A combined enhancement-depletion switching driver circuit comprising:
   a first inverter stage including a first driving enhancement metal-insulator-semiconductor transistor and a first load depletion metal-insulator-semiconductor transistor connected in series with a source of supply voltage, the gate and the drain of said first load transistor being coupled together;
   a second inverter stage including a second driving enhancement metal-insulator-semiconductor transistor and a second load depletion metal-insulator-semiconductor transistor connected in series with said source of supply voltage, an output node of said first inverter being coupled to the gate of said second load transistor;
   a third inverter stage including a third enhancement driving metal-insulator-semiconductor transistor and a third load depletion metal-insulator-semiconductor transistor connected in series with said source of supply voltage and providing an output of the circuit, an output node of said second inverter stage being coupled to the gate of said third load transistor;
   the gates of said first, second and third driving transistors being coupled to receive an input in common, and the impedance of each of said first and second load transistors being considerably higher than that of said third load transistor so that when the driving transistors are conductive, currents through said first and second load transistors are negligible with respect to that through said third load transistor.

4. A switching driver circuit comprising, in combination:
   an input terminal;
   a supply voltage terminal;
   a reference voltage terminal;
   an output terminal;
   a first inverter stage comprising a first enhancement mode driving field-effect transistor and a first depletion mode load fielf-effect transistor having their source-drain paths connected in series between said voltage terminals, the gate and drain of said first depletion mode transistor being connected in common;
   a second inverter stage comprising a second enhancement mode driving field-effect transistor and a second depletion mode load field-effect transistor having their source-drain paths connected in series between said voltage terminals, the juncture of said first transistors of said stage being connected to the gate of said second load transistor;
   a third inverter stage comprising a third enhancement mode driving field-effect transistor and a third depletion mode load field-effect transistor having their source-drain paths connected in series between said voltage terminals, the juncture of the second transistors of said second stage being connected to the gate of said third load transistor and the juncture of the third transistors of said third stage being connected to said output terminal;
   said input terminal being connected in common to the gates of each of said first, second and third enhancement mode transistors; and
   wherein the width to length ratio of the channel region of said third load transistor is more than two orders of magnitude as large as that of said first and second load transistors.

5. A switching driver circuit according to claim 4, wherein the impedances of said first and second load transistors are in excess of two orders of magnitude as large as that of said third load transistor.

* * * * *